United States Patent
Jeon

(10) Patent No.: US 7,134,059 B2
(45) Date of Patent: Nov. 7, 2006

(54) PAD CONNECTION STRUCTURE OF EMBEDDED MEMORY DEVICES AND RELATED MEMORY TESTING METHOD

(75) Inventor: Soon-Keun Jeon, Suwon (KR)

(73) Assignee: Samsung Electronics, Co., Ltd. (KR)

( * ) Notice: Subject to any disclaimer, the term of this patent is extended or adjusted under 35 U.S.C. 154(b) by 454 days.

(21) Appl. No.: 10/299,446

(22) Filed: Nov. 19, 2002

(65) Prior Publication Data
US 2003/0229831 A1    Dec. 11, 2003

(30) Foreign Application Priority Data
Jun. 7, 2002    (KR) ............................... 2002-31911

(51) Int. Cl.
*G11C 29/00* (2006.01)
*G01R 31/28* (2006.01)
(52) U.S. Cl. ...................... 714/718; 714/724
(58) Field of Classification Search ............... 714/718, 714/724
See application file for complete search history.

(56) References Cited

U.S. PATENT DOCUMENTS

| | | | | |
|---|---|---|---|---|
| 4,495,603 A | * | 1/1985 | Varshney | 365/233 |
| 4,602,210 A | * | 7/1986 | Fasang et al. | 714/731 |
| 4,782,283 A | * | 11/1988 | Zasio | 714/726 |
| 5,260,649 A | * | 11/1993 | Parker et al. | 714/727 |
| 5,815,512 A | * | 9/1998 | Osawa et al. | 714/726 |
| 5,841,784 A | | 11/1998 | Chan et al. | 371/21.1 |
| 5,889,713 A | | 3/1999 | Chan et al. | 365/201 |
| 5,920,515 A | * | 7/1999 | Shaik et al. | 365/200 |
| 5,978,304 A | * | 11/1999 | Crafts | 365/230.03 |
| 6,301,678 B1 | | 10/2001 | Sato et al. | 714/718 |
| 6,601,199 B1 | * | 7/2003 | Fukuda et al. | 714/719 |
| 6,686,759 B1 | * | 2/2004 | Swamy | 324/765 |

* cited by examiner

*Primary Examiner*—Joseph D. Torres
(74) *Attorney, Agent, or Firm*—Mills & Onello LLP

(57) ABSTRACT

In a pad connection structure for a plurality of embedded memory devices in a system-on-a-chip configuration, common pads are separately allotted to signal lines of embedded memory devices used for identical purposes and corresponding multiplexers are connected between the common pads and the signal lines of the embedded memory devices, thereby significantly reducing the number of input and output pads of the memory merged logic, minimizing damage to the pads, as a result of low probing frequency, and sequentially testing the embedded memory devices in a single testing operation.

9 Claims, 5 Drawing Sheets

PD1

MICON1 ———— L ————

L1

MICON2,3 ———— H ————

L2,L3 ———— L ————

L4

MOCON1 ———— L ————

PD2

MOCON2,3 ———— H ————

AA,BB ———— Hi-Z ————

PAD CONNECTION STRUCTURE OF EMBEDDED MEMORY DEVICES AND RELATED MEMORY TESTING METHOD

FIELD OF THE INVENTION

The present invention relates to a system-on-a-chip technology and more particularly to a pad connection structure for embedded memory devices fabricated using system-on-a-chip technology and a related memory testing method.

BACKGROUND OF THE INVENTION

In current semiconductor products, memory-merged logic is popular for a variety of memory configurations, including, for example, dynamic random access memory (DRAM), static random access memory (SRAM), flash memory and the like embedded on a single chip. For memory merged logic developed as a system-on-chip, as the degree of integration of embedded memory devices increases, for example to over 1M-bits of memory cells on a single chip, redundant memory cells have become popular in such systems.

Testing procedures are applied to memory-merged logic systems in order to determine the presence of defects in the memory cells of the embedded memory devices. For example, an Electrical Die Shorting (EDS) process may be employed. In this process, a probe connected to a tester system makes electrical connection with the embedded memory devices of the memory merged logic through a probing pad at the time of the memory tests.

Under conventional testing procedures, the respective tests are separately performed for the different embedded memory devices, such as DRAM, SRAM, flash memory and the like. Thus, test pins are allotted, without any consideration of the use of the pins, such as input, output and input/output pins, so that it has been possible to carry out separate tests for respective embedded memory devices. As such EDS tests are performed, the probe comes in contact with a probing pad a multiple number of times. Such high probing frequency tends to damage the probing pads, which in turn can lead to an decrease in the yield percentage of the semiconductor products.

SUMMARY OF THE INVENTION

In addressing the limitations of the conventional approaches, it is an object of the present invention to provide a pad connection structure for embedded memory devices and a related memory testing method that can sequentially test multiple embedded memory devices at the same time, in a single testing operation.

It is another object of the present invention to provide a pad connection structure and a related memory testing method that can minimize damage to the probing pads at the time of a wafer level test.

It is still another object of the present invention to provide a pad connection structure and a related memory testing method for significantly reducing the number of input and output pads of a memory merged logic.

It is further another object of the present invention to provide a pad connection structure and a related memory testing method for reducing the time required to test memories in a memory merged logic configuration.

In one aspect, the present invention is directed to a pad configuration. The pad configuration comprises a plurality of memory devices on a common integrated circuit. Each memory device has at least one signal line of a similar purpose with at least one signal line of the other memory devices. A multiplexer selectively couples one of the respective signal lines to a common pad, in response to a signal line selection signal.

The multiplexer may comprise multiple multiplexers, each for selectively coupling multiple signal lines of similar purpose of the multiple memory devices to one of multiple common pads. The signal lines may comprise, for example, input lines, output lines or input/output lines. The input lines are connected to input buffers of the embedded memory devices, the output lines are connected to output buffers thereof and the input/output lines are connected to input/output buffers thereof The memory devices comprise, for example, embedded memory devices of a type selected from the group consisting of static random access memory, dynamic random access memory and flash memory.

In another aspect, the present invention is directed to a method for testing a plurality of embedded memory devices on a common integrated circuit. A plurality of memory devices are provided on a common integrated circuit, each memory device having a signal line of a similar purpose with signal lines of the other memory devices. The respective signal lines of a similar purpose are selectively coupled at multiplexers to respective common pads in response to signal line selection signals. The embedded memory devices are sequentially tested at the common pads to respectively record and repair defective addresses of the embedded memory devices in a single test operation.

The step of sequentially testing may first perform a test on the embedded memory device requiring the shortest testing time period.

According to the instrumental and methodological configuration thus constructed, it is possible to significantly reduce the number of input and output pads of a memory merged logic, minimize damage to the pads as a result of the reduction in the number of probings, and sequentially test a plurality of embedded memory devices in a single testing procedure. In this manner, the time required to test memory devices of a memory merged logic circuit is decreased, thereby improving the price competitiveness of the resulting semiconductor products.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
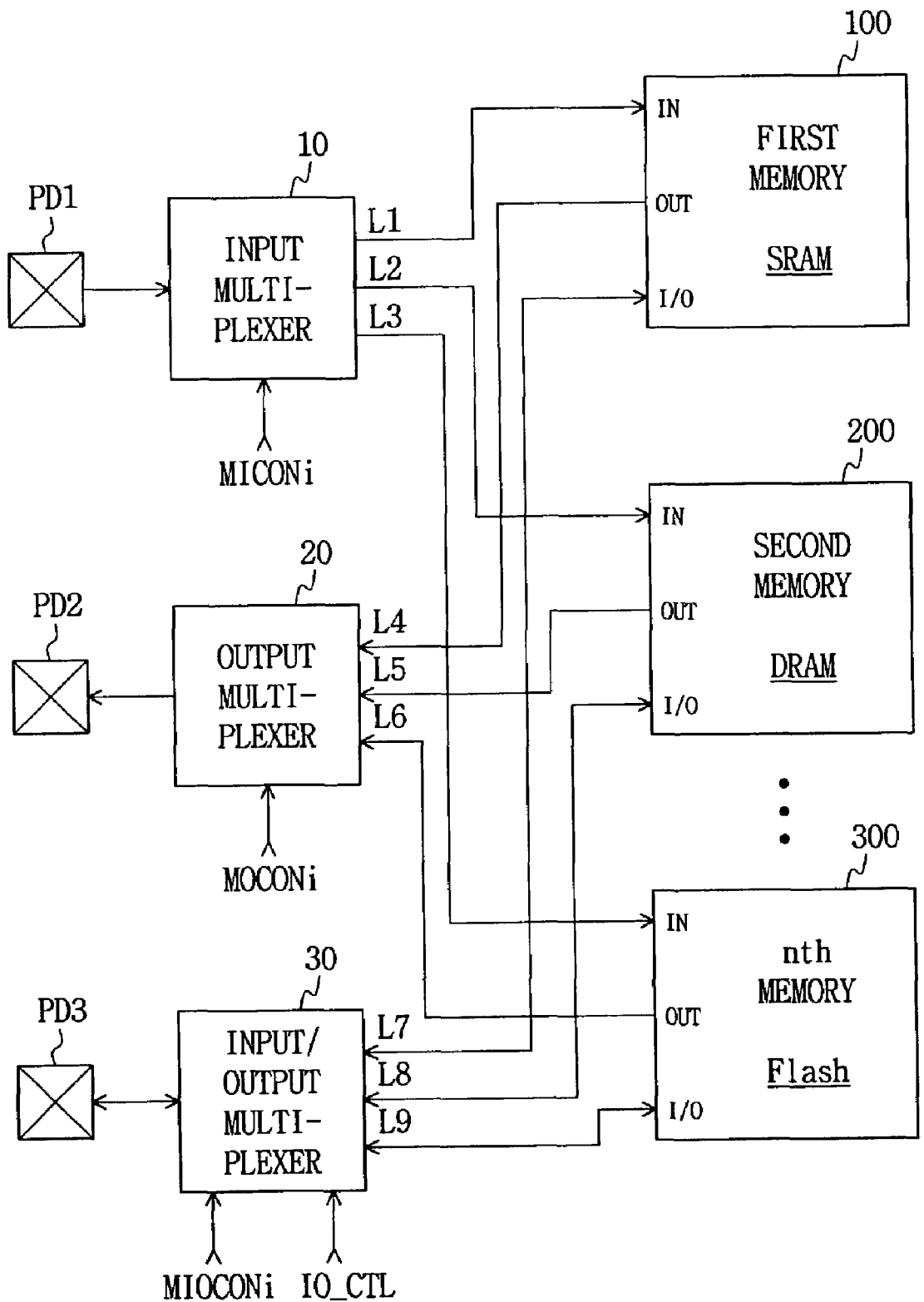
FIG. 1 illustrates a pad connection configuration of embedded memory devices in accordance with an embodiment of the present invention.

Hereinafter, a preferred embodiment of the present invention relating to a pad connection structure of embedded memory devices and a related memory testing method will be described in detail with reference to accompanying drawings. Parts having an identical or similar function will be designated with the same or similar reference numerals even if they are indicated differently in the drawings.

In the present invention, common pads are utilized, thereby eliminating independent input pads, output pads and input/output pads that otherwise would be separately arranged in the conventional embedded memory devices, in order to provide a pad connection structure to sequentially test all the embedded memory devices of a memory merged logic such as DRAM, SRAM, flash memory and the like in a single test operation. For example, an independent first input pad of the SRAM, first input pad of the DRAM and first input pad of the flash memory of the conventional approach are replaced by a common input pad that is coupled to an input multiplexer in the present invention. In the case of a plurality of input pads, the nth common input pad is replaced for the nth input pad of the SRAM, the nth input pad of the DRAM and the nth input pad of the flash memory and coupled to the nth input multiplexer.

Similarly, independent first through nth output pads of the SRAM, first through nth output pads of the DRAM and first through nth output pads of the flash memory according to the conventional configuration are replaced by a common output pad and coupled to an output multiplexer. Similarly, independent first through nth input/output pads of the SRAM, first through nth input/output pads of the DRAM and first through nth input/output pads of the flash memory are replaced with a common input/output pad and connected with an input/output multiplexer.

FIG. 1 is a schematic diagram of a pad connection structure for embedded memory devices in accordance with an embodiment of the present invention. In FIG. 1, there is provided a pad connection structure for a plurality of embedded memory devices (for example, SRAM—100, DRAM—200, Flash—300). The signal lines (L1–L3, L4–L6, L7–L9) are classified according to their similar use by the different types of memory devices, and those signal lines sharing a common purpose, for example an "input", "output" or "input/output" line are configured to share a common pad (PD1, PD2, PD3) via corresponding multiplexers (10, 20, 30). In this manner, the independent pads connected to each of the respective embedded memory devices are eliminated, and thus an input terminal (IN) of the first memory device (100) is not connected to an independent input pad, but instead is connected to the multiplexer, an output terminal (OUT) of the first memory device is not connected to an independent output pad, but instead is connected to the multiplexer, and an input/output terminal (I/O) of the first memory device is similarly connected to the multiplexer. Thus, the signal line (L1) is an input line connected directly between the input multiplexer (10) and the first memory, without a pad. In the same way, the signal lines (L2–L9) relate to those connected directly to the memory devices (200, 300) without any contact through pads.

The multiplexers (10, 20, 30) each operate to connect a respective pad (PD1, PD2, PD3) with a signal line of a corresponding memory (100, 200, 300). For example, input multiplexer (10) connects one of the signal lines (L1–L3) with the input pad (PD1) in response to an input multiplexing control signal (MICONi), output multiplexer (20) connects one of the signal lines (L4–L6) with the output pad (PD2) in response to an output multiplexing control signal (MOCONi), and input/output multiplexer (30) connects one of the signal lines (L7–L9) with the input/output pad (PD3) in response to an input/output multiplexing control signal (MIOCONi) and an input/output control signal (IO_CTL).

Figure 2:
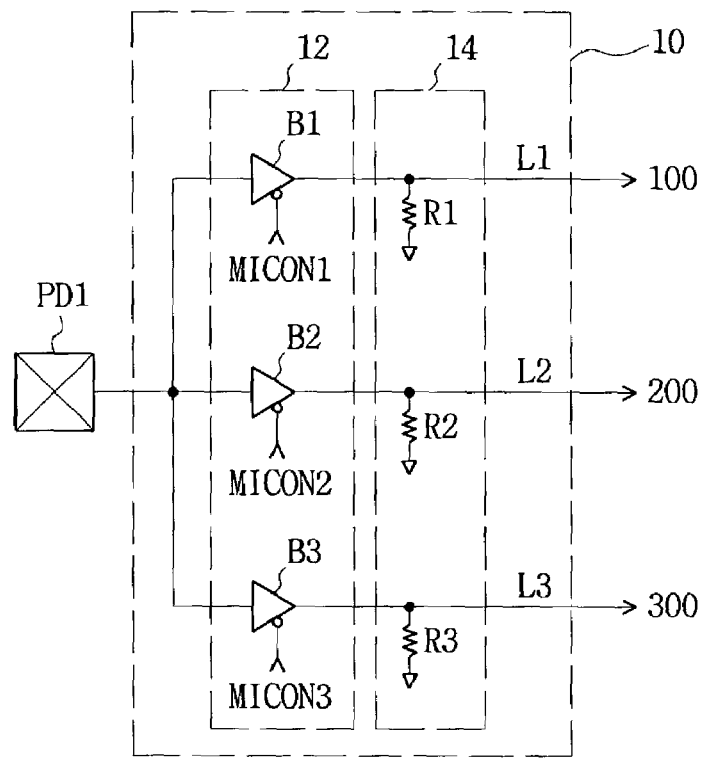
FIG. 2 illustrates an embodiment of the input multiplexer and the output multiplexer for the configuration illustrated in FIG. 1.
Figure 2:
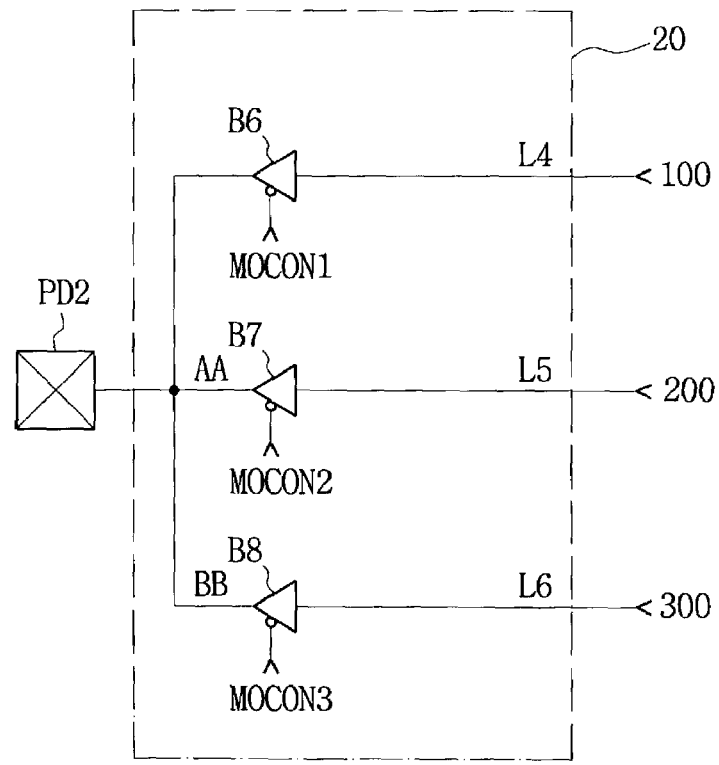

FIG. 2 illustrates an embodiment of the input and output multiplexers (10, 20) shown in FIG. 1. The input multiplexer (10) is constructed with three-phase buffers (B1, B2, B3) for respectively receiving input signals transmitted to the common input pad (PD1) at an input terminal and pulldown resistors (R1, R2, R3) connected between respective output terminals of the three-phase buffers (B1, B2, B3) and ground. Only one of the three-phase buffers (B1, B2, B3) of a three-phase buffer part (12) is enabled at any given time, according to the logic status of the input multiplexing control signal ((MICONi:MICON1,MICON2,MICON3) to provide for transmission of the input signal that is input at the input pad (PD1) for signal lines (L1, L2, L3).

The output multiplexer (20) is constructed with three-phase buffers (B6, B7, B8) that transfer to the common output pad (PD2) the output signals respectively provided at output signal lines (L4–L6) of the embedded memory devices. Only one of the three-phase buffers (B6, B7, B8) is enabled at any given time, according to a logic status of the output multiplexing control signal (MOCONi:MOCON1, MOCON2,MOCON3) to provide transmission of the output signal provided on the selected output signal line (L4–L6) to a common output pad (PD2).

Figure 3:
FIG. 3 is an operational timing diagram relating to the embodiment of FIG. 2.
Figure 3:
Figure 3:
Figure 3:

FIG. 3 is a timing diagram illustrating the operation of the embodiment of FIG. 2. Assume that an input signal, such as a signal waveform PD1, is shifted to the common input pad (PD1), the multiplexing control signal (MICON1) is "low" status, and the rest of input multiplexing control signals (MICON2, MICON3) are "high" status. In this case, only three-phase buffer (B1) is enabled so as to allow the input signal PD1 to be transferred to signal line L1. At this time, the other three-phase buffers (B2, B3) are disabled to thereby drive the signal lines (L2, L3) at a "low" status by the pulldown resistors (R2, R3). In this manner, an input signal provided to test the signal line (L1) connected to the input of the SRAM (100). If an input signal is provided at the pad PD1 for the signal line (L2) connected to the second memory, then only the input multiplexing control signal (MICON2) is shifted in the "low" status. It is preferable that the input multiplexing control signal (MICONi) is provided by the test equipment during test mode, and may be provided by a system processor during a normal operational mode.

On the other hand, assuming an output signal such as signal waveform (L4) of FIG. 3 is provided on signal line (L4), the output multiplexing control signal (MOCON1) is in "low" status, and the remaining output multiplexing control signals (MOCON2, MOCON3) are in "high" status, only the three-phase buffer (B6) is enabled, so as to cause the output signal of signal waveform L4 to appear at the output pad (PD2). At this time, the other three-phase buffers (B7, B8) are disabled, and the logic statuses of the signal lines (L5, L6) are in the high impedance phase. In this manner, the common output pad (PD2) provides the output signal of signal line (L4) that is connected to the output buffer of the SRAM (100).

Figure 4:
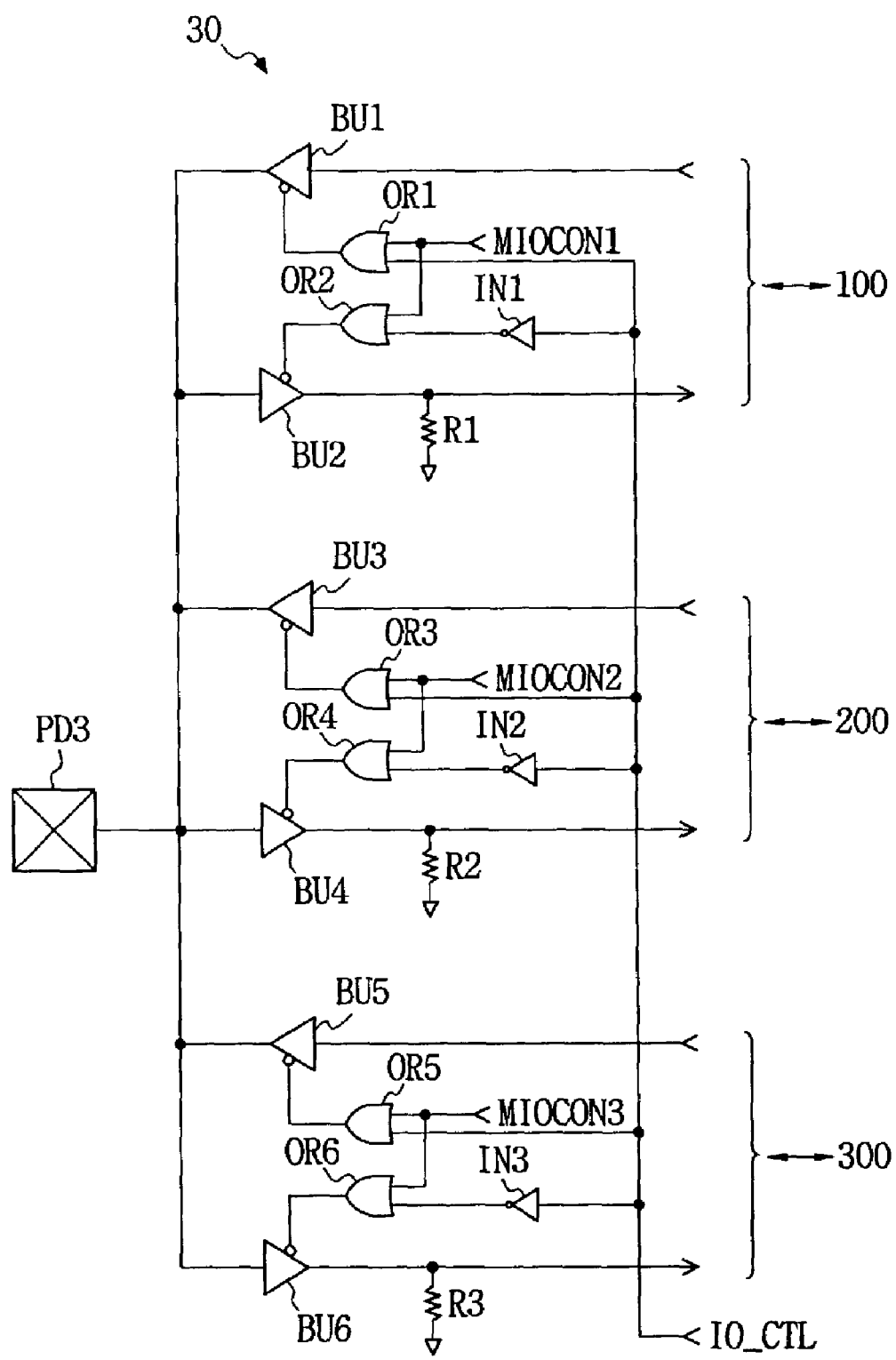
FIG. 4 illustrates an embodiment of the input/output multiplexer for the configuration illustrated in FIG. 1.

FIG. 4 illustrates an embodiment of the input/output multiplexer (30) of FIG. 1. With reference to FIG. 1, output terminals of the three-phase buffers (BU1, BU3, BU5) are commonly connected with the input/output pad (PD3) and with input terminals of the three-phase buffers (BU2, BU4, BU6). The pulldown resistors (R1, R2, R3) are respectively connected between output terminals of the three-phase buffers (BU2, BU4, BU6) and ground. OR gates (OR1–OR6) are correspondingly connected with control terminals of the three-phase buffers (BU1–BU6), input/output multiplexing control signals (MIOCONi:MIOCON1,MIOCON2,MIOCON3) are respectively provided to one of the input terminals of the OR gates (OR1, OR3, OR5), and an input/output control signal (IO_CTL) is commonly provided to the other input terminals thereof. Input/output multiplexing control signals (MIOCONi:MIOCON1,MIOCON2,MIOCON3) are respectively provided to one of the input terminals of the OR gates (OR2, OR4, OR6), and an input/output control signal (IO_CTL) is commonly provided to the other input terminals thereof through corresponding inverters (IN1, IN2, IN3).

Assuming the logic state of the input/output multiplexing control signal (MICON1) is in the "low" status, and assuming the input/output control signal (IO_CTL) is in the "low" status, then only the output of the OR gate (OR1) becomes "low", to enable only the three-phase output buffer (BU1). In this case, an output signal provided at signal line (L7) of the first memory (100) appears at the input/output pad (PD3). Assuming instead that the logic state of the input/output multiplexing control signal (MIOCON1) is in the "low" status, and assuming the input/output control signal (IO_CTL) is in the "high" status, then only the output of the OR gate (OR2) becomes "low" to enable only the three-phase buffer (BU2). In this case, the input signal shifted to the input/output pad (PD3) is provided for the input/output buffer through the signal line (L7) of the first memory (100).

The pad connection structure described above makes it possible to significantly reduce the number of allotted pads and to sequentially test a plurality of embedded memory devices in a single test operation, by probing the test device at common pads without the need for moving the test head. The resultant pad structure is the equivalent of connecting similar types of pins to respective multiplexers, such that it is possible to sequentially perform tests to respective embedded memory devices by electronic selection of modes without a need to mechanically vary the test equipment. In addition, the information with respect to failures that may occur during the test process is formatted according to a predetermined rule, and repairs can be performed at the same time according to respective repair address data on a plurality of embedded memory devices at the time of laser repair for replacing defective memory cells with redundant memory cells. Therefore, it is possible to reduce the time consumed by laser repairs as well as by tests.

Figure 5:
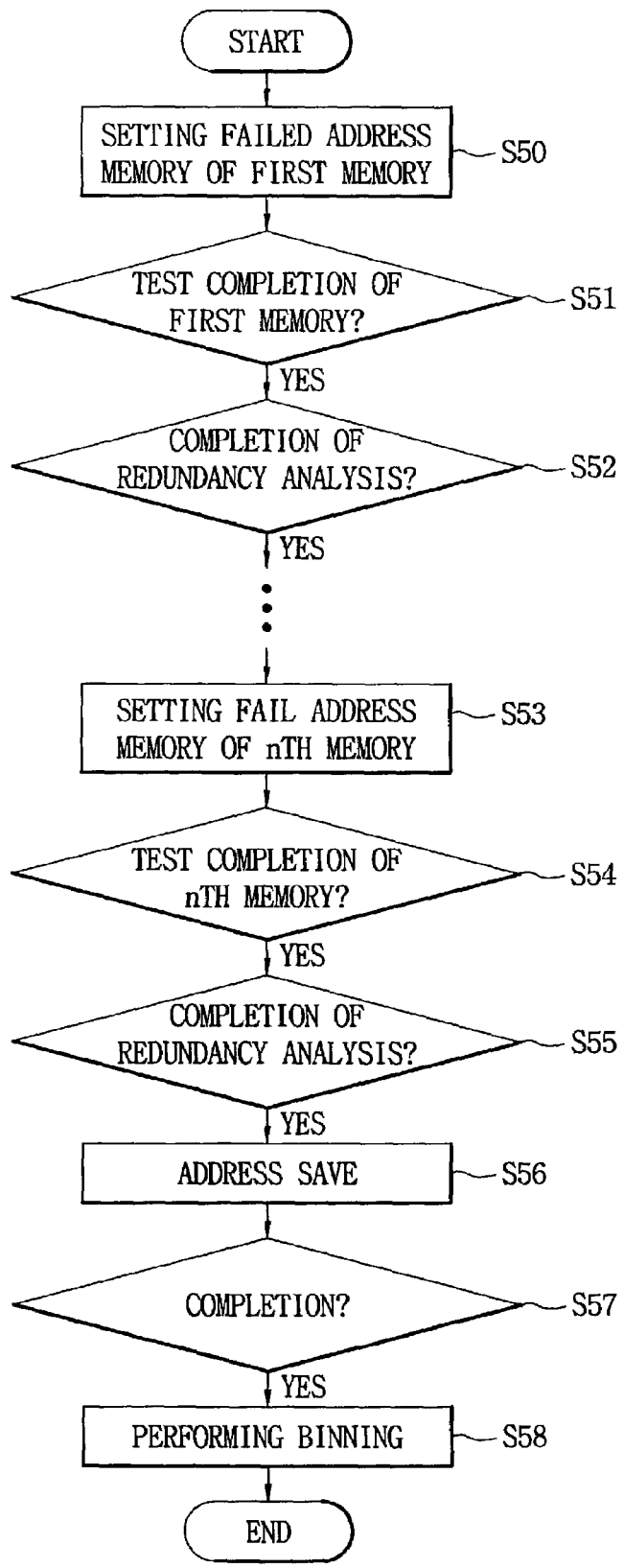
FIG. 5 is a flow diagram of the operation of the memory device in accordance with an embodiment of the present invention.

FIG. 5 is a flow diagram for a memory test in accordance with an embodiment of the present invention, including steps S50 through S58.

Common pads connected through multiplexers to signal lines used for similar purposes are set up to construct the merged memory devices having embedded memory devices in the pad connection structure shown in FIG. 1. Then, memory tests are first carried out for the SRAM (100) device for which the testing time is to be taken the shortest, and a test result is temporarily stored. After a memory test is completely carried out for the DRAM (200) and the flash memory (300), final information on failed addresses is issued according to the specified rules.

Steps S50, S51 and S52 of FIG. 5 relate to a test control flow for the SRAM (100). At step S50, a test processor sets up a fail address memory test for the first memory (100) at an internal storing memory region, performs a test, and stores failed addresses related to memory cells of the first memory (100). At step S51, it is determined whether the test on the SRAM (100) is completed or not. If so, redundancy information is analyzed according to failed addresses that are stored in the failed address memory at step S52. When step S52 is completed, another test is carried out for the second memory (200), DRAM for instance, without a need for a change in the probing configuration.

Next, steps S53, S53, and S55 relate to a test control flow for the DRAM (200) and the flash memory (300). Only the objects to be tested are different, and the operational steps of steps S53, S54, and S55 are identical to steps S50, S51 and S52. When step S55 is completed, memory tests have been conducted for all the embedded memory devices. Then, the flow proceeds to steps S56, S57 and S58.

Step S56 relates to a step of collecting and storing redundancy addresses at the first memory through the nth memory. When the storing process is completed at step S57, the flow advances to step S58. Step S58 relates to a binning process, where redundancy addresses are formatted into a predetermined code according to a preset rule for automatic laser repair operations. For instance, the binning process of the first embedded memory device is formatted into code X0000000-X00FFFFF, the second embedded memory device into code X0100000-X01FFFFF and the third embedded memory device into code X1000000-X10FFFFF. At this time, the designations "00","01" and "10" correspond to the classifications of the type of embedded memory devices.

Likewise, all tests are sequentially carried out for the plurality of embedded memory devices with respective common pads for completing the treatment and repair steps to defective addresses at one time, so as to make it possible to significantly reduce the number of input and output pads at the memory merged logic, minimize damage to the pads due to the low probing frequency and sequentially test a plurality of embedded memory devices at the same time. In addition, price competitiveness of the resulting products is improved by reduction in the time to test memory devices of the memory merged logic, and resources of testing equipment can be used more efficiently.

Having described a specific embodiment of the present invention with reference to the accompanying drawings, it is to be understood that the invention is not limited to the precise embodiments disclosed, and that various changes and modifications can be effected therein by one skilled in the art without departing from the scope or spirit of the invention. For instance, various types of changes can be made to the specific parts or structure of multiplexers in other embodiments of the invention.

What is claimed is:

1. A pad configuration, comprising
   a plurality of pads, including first, second, and third common pads;
   a plurality of embedded memory devices on a common integrated circuit, each embedded memory device having at least one first, second, and third signal lines of first, second, and third similar purposes with at least one first, second, and third signal lines of the other embedded memory devices, respectively, wherein the at least one first signal lines of each memory device are grouped into a first signal line group, the at least one second signal lines of each memory device are grouped into a second signal line group, and the at least one third signal lines of each memory device are grouped into a third signal line group; and
   an input/output device, including first, second, and third selective coupling devices, wherein in response to a first signal line selection signal, the first selective coupling device selects one first signal line of the first signal line group to form a first conductive path between the first common pad and a first memory device of the plurality of embedded memory devices, wherein, in response to a second signal line selection signal that is generated independently of the first signal line selection signal, the second selective coupling device selects one second signal line of the second signal line group to form a second conductive path between the second common pad and a second memory device of the plurality of embedded memory devices, and wherein, in response to a third signal line selection signal that is generated independently, of the first and second signal line selection signals, the third selective coupling device selects one third signal line of the third signal line group to form a third conductive path between the third common pad and a third memory device of the plurality of embedded memory devices.

2. The pad configuration of claim 1, wherein the first, second, and third signal lines comprise input lines, output lines and input/output lines, respectively.

3. The pad configuration of claim 2, wherein the input lines are connected to input buffers of the embedded memory devices, the output lines are connected to output buffers thereof and the input/output lines are connected to input/output buffers thereof.

4. The pad configuration of claim 1, wherein the embedded memory devices comprise embedded memory devices of a type selected from the group consisting of static random access memory, dynamic random access memory and flash memory.

5. The pad configuration of claim 1, wherein any combination of the first memory device, the second memory device, and the third memory device is a single embedded memory device of the plurality of embedded devices.

6. A method for testing a plurality of embedded memory devices on a common integrated circuit, the method comprising the steps of:

providing a plurality of embedded memory devices on a common integrated circuit, each embedded memory device having at least one first, second, and third signal lines of first, second, and third similar purposes with at least one first, second, and third signal lines of the other memory devices, respectively, wherein the at least one first signal lines of each memory device are grouped into a first signal line group, the at least one second signal lines of each memory device are grouped into a second signal line group, and the at least one third signal lines of each memory device are grouped into a third signal line group;

selectively coupling, at an input/output device comprising first, second, and third selective coupling devices, one signal line of a line group of the first, second, and third signal line groups to a common pad of a plurality of common pads, in response to signal line selection signals, wherein, in response to a first signal line selection signal, the first selective coupling device selects one first signal line of the first signal line group to form a first conductive path between a first common pad of the plurality of common pads and a first memory device of the plurality of embedded memory devices, wherein, in response to a second signal line selection signal that is generated independently of the first signal line selection signal, the second selective coupling device selects one second signal line of the second signal line group to form a second conductive path between a second common pad of the plurality of common pads and a second memory device of the plurality of embedded memory devices, and wherein, in response to a third signal line selection signal that is generated independently of the first and second signal line selection signals, the third selective coupling device selects one third signal line of the third signal line group to form a third conductive path between a third common pad of the plurality of common pads and a third memory device of the plurality of embedded memory devices; and sequentially testing the embedded memory devices at the common pads to respectively record and repair defective addresses of the embedded memory devices in a single test operation.

7. The method of claim 6, wherein the step of sequentially testing first performs a test on the embedded memory device requiring the shortest testing time period.

8. The method of claim 6, wherein the embedded memory devices are selected from a group consisting of static random access memory, dynamic random access memory and flash memory.

9. The pad configuration of claim 6, wherein any combination of the first memory device, the second memory device, and the third memory device is a single embedded memory device of the plurality of embedded devices.

* * * * *

UNITED STATES PATENT AND TRADEMARK OFFICE
CERTIFICATE OF CORRECTION

PATENT NO.         : 7,134,059 B2                                       Page 1 of 1
APPLICATION NO. : 10/299446
DATED              : November 7, 2006
INVENTOR(S)        : Soon-Keun Jeon It is certified that error appears in the above-identified patent and that said Letters Patent is hereby corrected as shown below:

Column 6, line 7, delete the second occurence of "S53" and insert --S54--

Column 7, line 13, delete "," after "independently"

Signed and Sealed this

Tenth Day of April, 2007

JON W. DUDAS
*Director of the United States Patent and Trademark Office*